(12) United States Patent
Lee et al.

(10) Patent No.: US 10,826,454 B2
(45) Date of Patent: *Nov. 3, 2020

(54) AUDIO SIGNAL MUTING APPARATUS, AND DIGITAL SIGNAL CONVERSION APPARATUS EQUIPPED WITH SAME

(71) Applicant: DREAMUS COMPANY, Seoul (KR)

(72) Inventors: Jeong Ho Lee, Gwacheon (KR); Seung Ho Yu, Incheon (KR); Ji Heon Ahn, Yongin (KR); Woo Suk Kim, Bucheon (KR)

(73) Assignee: DREAMUS COMPANY, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/603,163

(22) PCT Filed: Jun. 2, 2017

(86) PCT No.: PCT/KR2017/005783
§ 371 (c)(1),
(2) Date: Oct. 4, 2019

(87) PCT Pub. No.: WO2018/186526
PCT Pub. Date: Oct. 11, 2018

(65) Prior Publication Data
US 2020/0036355 A1    Jan. 30, 2020

(30) Foreign Application Priority Data

Apr. 7, 2017 (KR) .......... 10-2017-0045406
May 29, 2017 (KR) .......... 10-2017-0066213

(51) Int. Cl.
*H03G 3/34* (2006.01)
*G06F 3/16* (2006.01)
(Continued)

(52) U.S. Cl.
CPC ............. *H03G 3/341* (2013.01); *G06F 3/165* (2013.01); *H03F 3/183* (2013.01); *H03F 3/185* (2013.01);
(Continued)

(58) Field of Classification Search
CPC ...... H03G 3/341; H03G 3/3089; H03G 3/348; G06F 3/165; H03F 3/185; H03F 3/68; H03F 2200/03; H04R 3/00
(Continued)

(56) References Cited

U.S. PATENT DOCUMENTS

2007/0222504 A1* 9/2007 Bates ............... H03F 1/305
  330/9
2010/0004936 A1* 1/2010 Chao ............... H03F 1/305
  704/500

FOREIGN PATENT DOCUMENTS

JP   2008193341    *  8/2008
JP   2008193341 A    8/2008
(Continued)

OTHER PUBLICATIONS

International Search Report dated Dec. 28, 2017 for PCT Application No. PCT/KR2017/005783.

*Primary Examiner* — Norman Yu

(57) ABSTRACT

The present invention proposes an audio signal muting apparatus setting and adjusting a time for removing pop noise and muting an audio signal based on the set and adjusted timing. Further, the present invention proposes a digital signal converting apparatus for muting an analog audio signal based on a timing for removing pop noise when converting a digital audio signal into an analog audio signal in connection with an audio signal reproducing apparatus.

12 Claims, 6 Drawing Sheets

(51) Int. Cl.
*H04R 3/00* (2006.01)
*H03G 3/30* (2006.01)
*H03F 3/185* (2006.01)
*H03F 3/183* (2006.01)
*H03M 1/66* (2006.01)
*H04R 3/14* (2006.01)
*H05K 1/18* (2006.01)
*H03F 3/68* (2006.01)
*H03F 3/21* (2006.01)

(52) U.S. Cl.
CPC ........... *H03G 3/3089* (2013.01); *H03G 3/344* (2013.01); *H03G 3/348* (2013.01); *H03M 1/66* (2013.01); *H04R 3/00* (2013.01); *H04R 3/14* (2013.01); *H05K 1/181* (2013.01); *H03F 3/21* (2013.01); *H03F 3/68* (2013.01); *H03F 2200/03* (2013.01); *H05K 2201/10083* (2013.01)

(58) Field of Classification Search
USPC .... 381/71.4, 71.9, 71.13, 86, 94.5, 123, 120
See application file for complete search history.

(56) References Cited

FOREIGN PATENT DOCUMENTS

| | | |
|---|---|---|
| KR | 1020080067237 A | 7/2008 |
| KR | 100860022 B1 | 9/2008 |
| KR | 1020100049199 A | 5/2010 |
| KR | 10-20100049199 * | 12/2010 |

* cited by examiner

[FIG. 1]
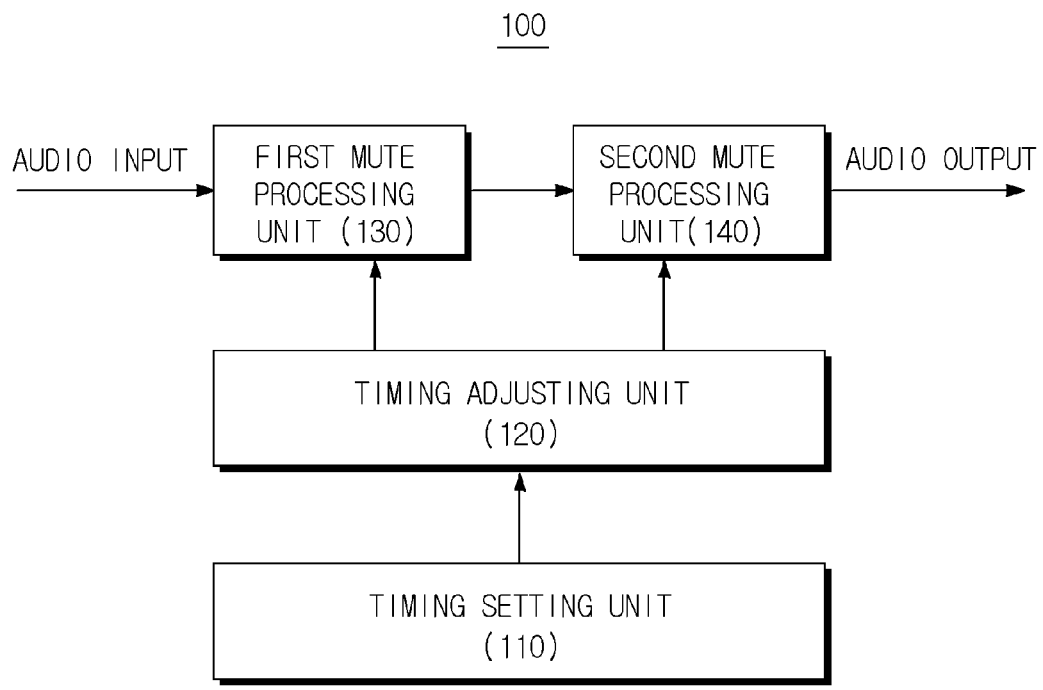

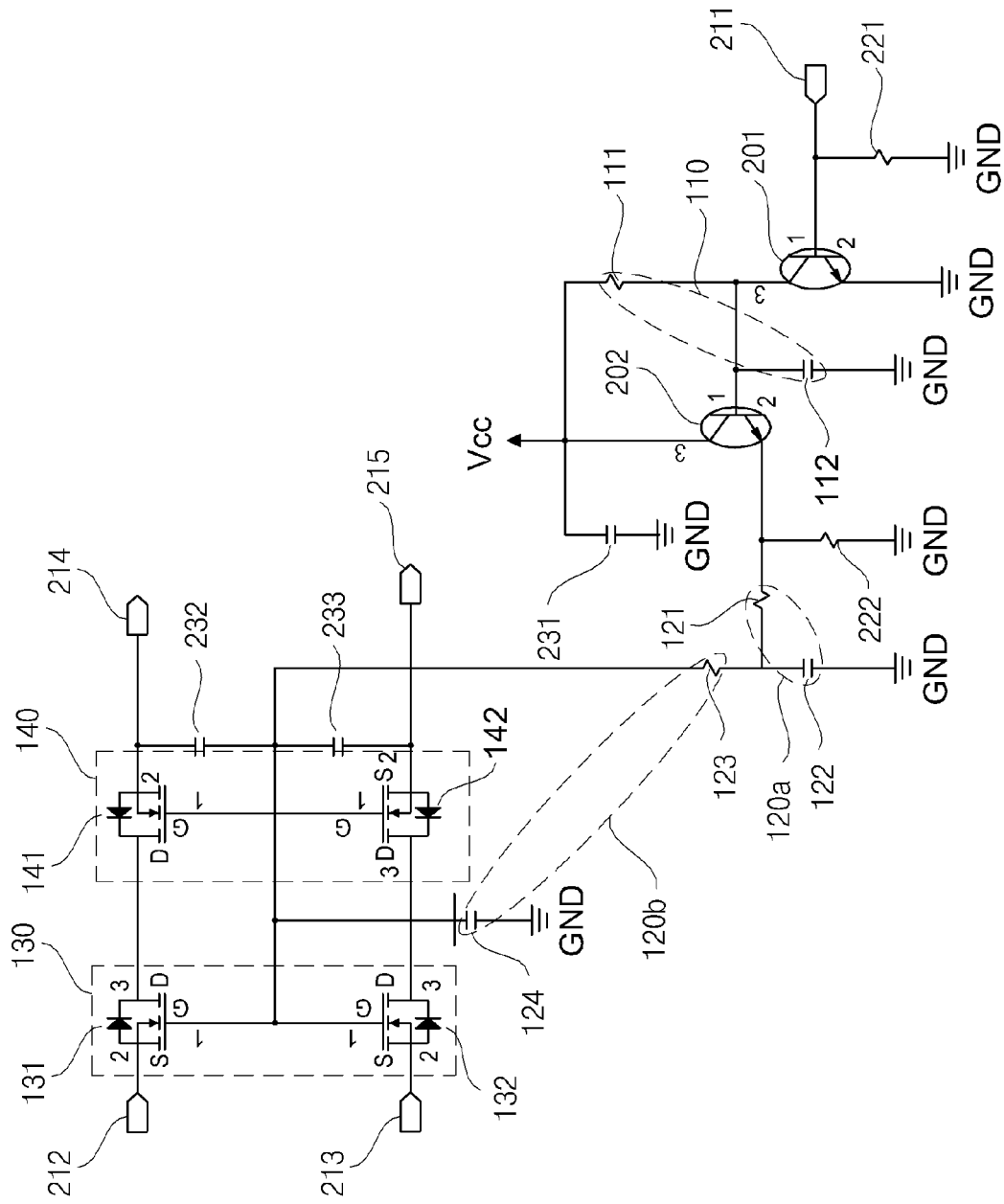
[FIG. 2]

[FIG. 3]
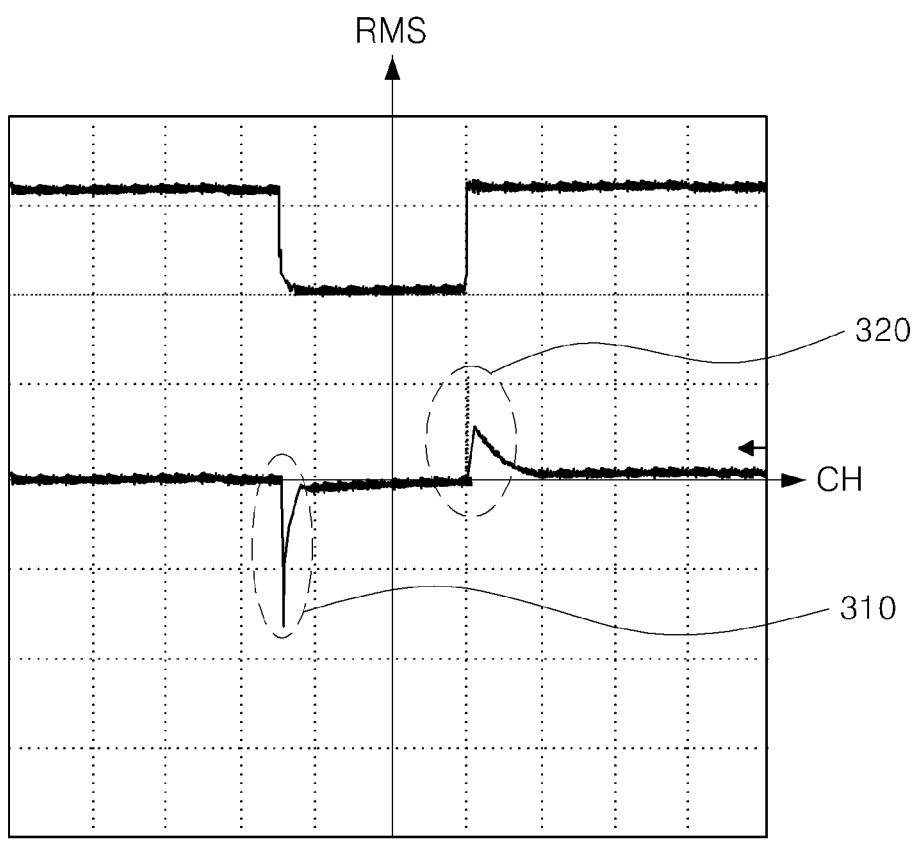

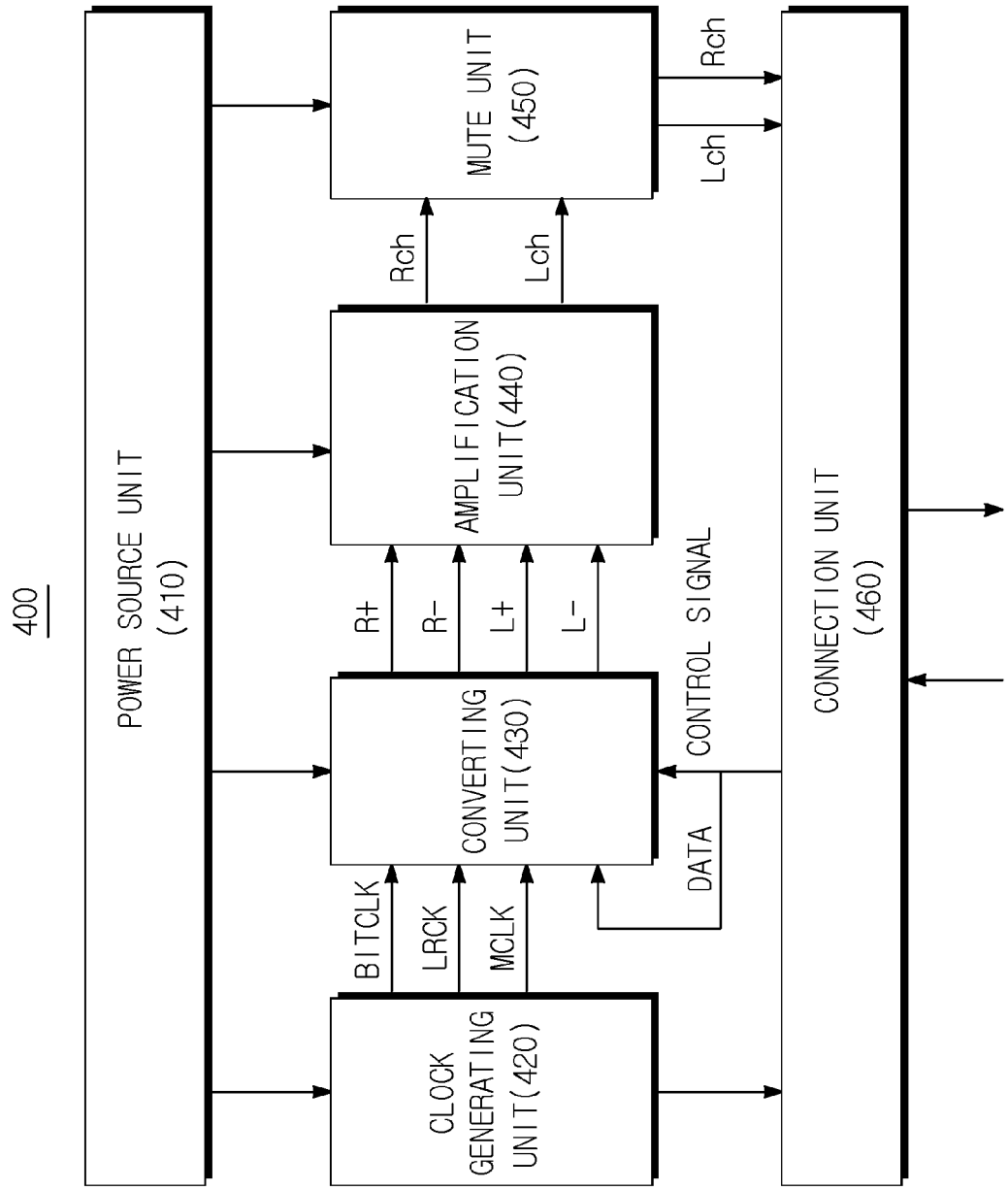

[FIG. 5]
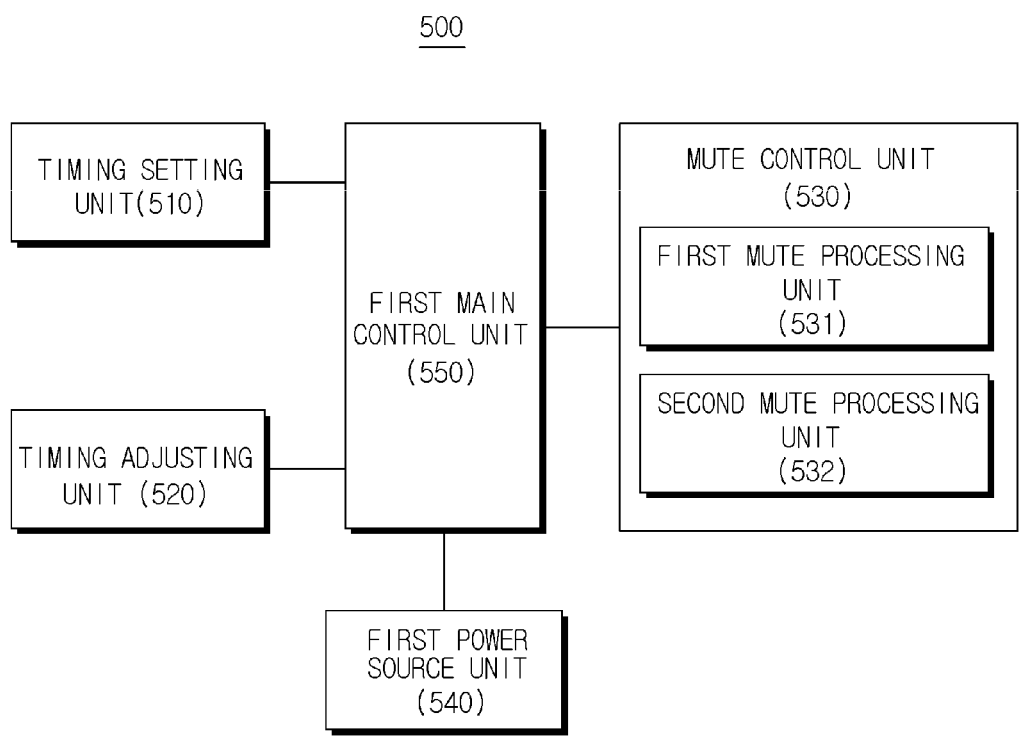

[FIG. 6]
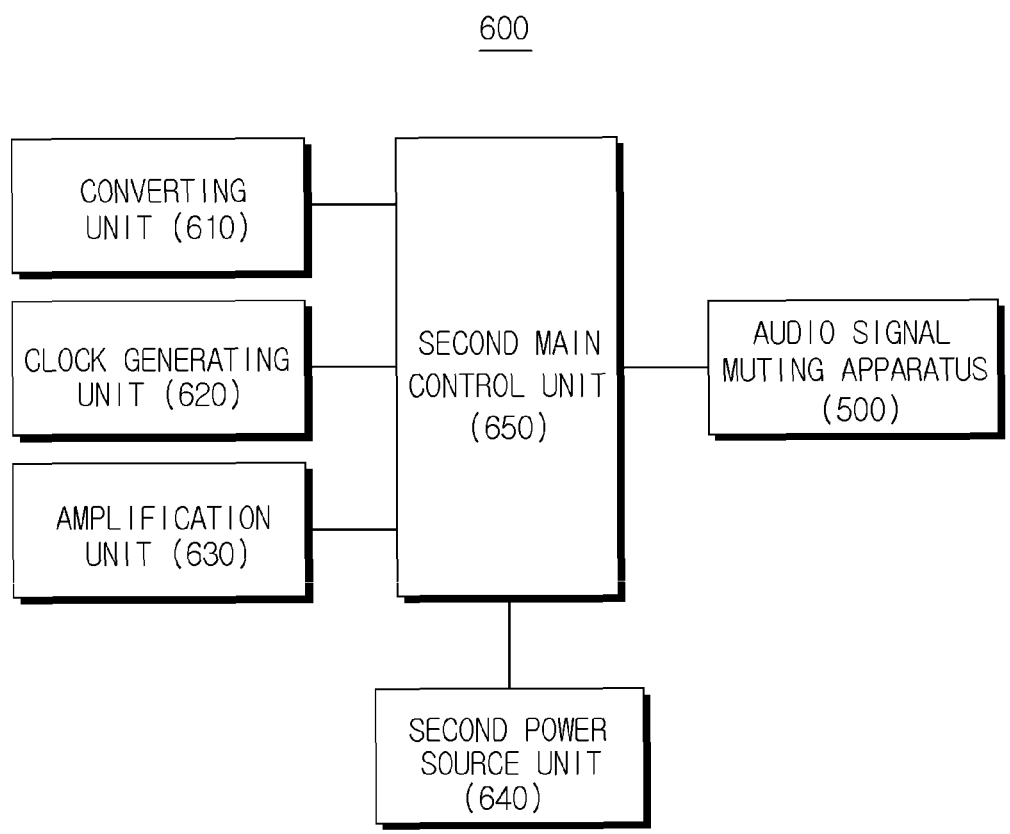

AUDIO SIGNAL MUTING APPARATUS, AND DIGITAL SIGNAL CONVERSION APPARATUS EQUIPPED WITH SAME

CROSS-REFERENCE TO RELATED APPLICATIONS

This application is a national stage application, filed under 35 U.S.C. § 371, of International Patent Application No. PCT/KR2017/005783, filed on Jun. 2, 2017, which claims priority to and the benefit of Korean Patent Application No. 10-2017-0045406 filed in the Korean Intellectual Property Office on Apr. 7, 2017, Korean Patent Application No. 10-2017-0066213 filed in the Korean Intellectual Property Office on May 29, 2017, the entire contents of which are incorporated herein by reference.

TECHNICAL FIELD

The present invention relates to an apparatus for muting an audio signal. Further, the present invention relates to an apparatus for converting a digital audio signal into an analog audio signal in connection with an audio signal reproducing apparatus.

BACKGROUND ART

When a digital to analog converter (DAC) is used in an audio signal reproducing apparatus that reproduces an audio signal, a sound of a clearer and rich sound source may be provided to a user. In order to further enhance a sound quality of the audio signal as described above, a digital signal converting apparatus is largely spotlighted which is mounted on an electronic apparatus having an audio signal reproducing function, such as an MP3 player, and an audio for a vehicle to select a signal of a quality suitable for a taste and a purpose of a user.

However, when the digital signal converting apparatus is electrically connected to the audio signal reproducing apparatus and then, power is applied to the digital signal converting apparatus or the power is turned off, there is a problem in that pop noise is generated. Further, there is also a problem in that the sound quality of the audio signal deteriorates due to the pop noise.

DISCLOSURE

Technical Problem

The present invention has been made in an effort to propose an audio signal muting apparatus for setting and adjusting a timing for removing pop noise and muting an audio signal based on the set and adjusted timing.

Further, the present invention has been made in an effort to propose a digital signal converting apparatus for muting an analog audio signal based on a timing for removing pop noise when converting a digital audio signal into an analog audio signal in connection with an audio signal reproducing apparatus.

However, the objects of the present invention are not limited to the aforementioned matters, and other objects, which are not mentioned above, will be apparent to a person having ordinary skill in the art from the following description.

Technical Solution

The present invention is contrived to achieve the object and proposes an apparatus for muting an audio signal, which includes: a timing setting unit setting a timing for removing pop noise from an audio signal; a timing adjusting unit adjusting the timing; and a mute control unit muting the audio signal based on the timing.

Preferably, the mute control unit includes a first mute processing unit muting the audio signal at a time when negative pop noise exists based on the timing, and a second mute processing unit muting the audio signal at a time when positive pop noise exists based on the timing.

Preferably, the first mute processing unit or/and the second mute processing unit includes two voltage control elements.

Preferably, pins of a first voltage control element provided in the first mute processing unit are disposed to face the pints of a second voltage control element provided in the first mute processing unit, and the pins of a third voltage control element provided in the second mute processing unit are disposed to face the pints of a fourth voltage control element provided in the second mute processing unit.

Preferably, the timing setting unit includes a first voltage adjusting element adjusting output voltage related to the audio signal, and a first charge element connected to the first resistor in parallel.

Preferably, one side of the first voltage adjusting element is connected to a first current control element receiving a mute control signal for muting the audio signal and the other side is connected to a ground GND.

Preferably, at least two timing adjusting units are provided.

Preferably, the timing adjusting unit includes a third voltage adjusting element additionally adjusting output voltage with respect to the audio signal of which output voltage is adjusted by the timing setting unit, a second charge element connected to the third voltage adjusting element in series through a first path, a fifth voltage adjusting element additionally adjusting the output voltage with respect to the audio signal of which output voltage is adjusted by the third voltage adjusting element, and a fourth charge element connected to the fifth voltage adjusting element in series.

Preferably, one side of the third voltage adjusting element is connected to a second current control element connected to the first current control element receiving the mute control signal for muting the audio signal and the other side is connected to the fifth voltage adjusting element through a second path, and one side of the fifth voltage adjusting element is connected to the third voltage adjusting element in series through the second path and the other side of the fifth voltage adjusting element is connected to the mute control unit.

Preferably, the first current control element is an element that performs a switching function in connection to the ground and the second current control element is an element that is connected to a power source and performs the switching function.

Preferably, the timing setting unit sets the timing based on at least one pop noise of which magnitude is equal to or larger than a first reference value, and the timing adjusting unit adjusts the timing based on at least one pop noise of which magnitude is equal to or larger than a second reference value smaller than the first reference value.

Further the present invention proposes an apparatus for converting a digital signal, which includes: a converting unit converting, when a digital audio signal is input, the digital audio signal into an analog audio signal; a clock generating unit determining an operation timing when converting the digital audio signal into the analog audio signal based on the digital audio signal; an amplification unit amplifying the analog audio signal; and an audio signal muting apparatus muting the analog audio signal based on a timing for removing pop noise.

Preferably, the audio signal muting apparatus includes a timing setting unit setting a timing for removing pop noise from the analog audio signal, a timing adjusting unit adjusting the timing, and a mute control unit muting the analog audio signal based on the timing.

Preferably, the mute control unit includes a first mute processing unit muting the audio signal at a time when negative pop noise exists based on the timing, and a second mute processing unit muting the audio signal at a time when positive pop noise exists based on the timing.

Advantageous Effects

According to the present invention, the following effects can be obtained through configurations for achieving the object.

First, it is possible to remove pop noise. In particular, it is possible to remove negative pop noise in addition to positive pop noise.

Second, it is possible to enhance a quality of an audio signal.

DESCRIPTION OF DRAWINGS

FIG. 1 is a block diagram schematically illustrating an internal configuration of a mute apparatus according to an embodiment of the present invention.

FIG. 2 is a circuit diagram specifically illustrating an internal configuration of a mute apparatus according to an embodiment of the present invention.

FIG. 3 is a reference diagram for describing a function performed by a mute apparatus according to an embodiment of the present invention.

FIG. 4 is a block diagram schematically illustrating an internal configuration of a digital signal converting apparatus according to an embodiment of the present invention.

FIG. 5 is a conceptual diagram schematically illustrating an internal configuration of an audio signal muting apparatus according to a preferred embodiment of the present invention.

FIG. 6 is a conceptual diagram schematically illustrating an internal configuration of a digital signal converting apparatus according to a preferred embodiment of the present invention.

BEST MODE

Hereinafter, a preferred embodiment of the present invention will be described in detail with reference to the accompanying drawings. When reference numerals refer to components of each drawing, it is to be noted that although the same components are illustrated in different drawings, the same components are denoted by the same reference numerals as possible. Further, in describing the present invention, a detailed explanation of known related configurations and functions may be omitted to avoid unnecessarily obscuring the subject matter of the present invention. Further, hereinafter, the preferred embodiment of the present invention will be described, but the technical spirit of the present invention is not limited thereto or restricted thereby and the embodiments can be modified and variously executed by those skilled in the art.

The present invention proposes a mute apparatus for removing pop noise, which may be applied to a digital signal converting apparatus. Hereinafter, a mute apparatus proposed by the present invention will be described in detail with reference to drawings.

FIG. 1 is a block diagram schematically illustrating an internal configuration of a mute apparatus according to an embodiment of the present invention.

According to FIG. 1, the mute apparatus 100 includes a timing setting unit 110, a timing adjusting unit 120, a first mute processing unit 130, and a second mute processing unit 140.

An audio signal reproducing apparatus which reproduces an audio signal includes a computer, a video apparatus, an MP3 player, an audio apparatus in an electric component for a vehicle, and the like as an example thereof.

The audio signal reproducing apparatus may be implemented as a Hi-Fi audio module as an example thereof. In this case, since a voltage level of the audio signal output from the Hi-Fi audio module is very high, a digital signal converting apparatus preferably includes the mute apparatus 100 in order to control a high output. The mute apparatus 100 proposed by the present invention may be included in the digital signal converting apparatus by considering such a point.

The mute apparatus 100 may have an optimized configuration for the high output and include the timing setting unit 110 and the timing adjusting unit 120 in order to adjust a timing.

When the audio signal having the high output is input, the timing setting unit 110 performs a function to primarily set a mute timing with respect to the audio signal. Specifically, the timing setting unit 110 serves to set an overall mute timing. The timing setting unit 110 may serve to set the overall mute timing by setting the mute timing over the entire input audio signal.

The timing adjusting unit 120 serves to secondarily adjust the mute timing with respect to the audio signal in which the mute timing is primarily set by the timing setting unit 110. Specifically, the timing adjusting unit 120 serves to set a precise timing of the mute. The timing adjusting unit 120 may serve to set the precise timing of the mute by adjusting the mute timing with respect to each part of the audio signal in which the mute timing is set.

At least one timing adjusting unit 120 may be provided in the embodiment. Since a fine timing of the mute is preferably performed at least twice in order to increase accuracy of the timing, at least two timing adjusting units 120 are preferably provided in the embodiment.

When the mute apparatus 100 includes only the timing setting unit 110, there may be a problem in that pop noise is rather generated when the mute apparatus 100 mutes the audio signal. In the present invention, it is preferable that the mute apparatus 100 includes at least one timing adjusting unit 120 together with the timing setting unit 110 by considering such a point.

When the audio signal having the high output is input, the first mute processing unit 130 serves to primarily mute the audio signal based on the mute timing set and adjusted by the timing setting unit 110 and the timing adjusting unit 120.

The digital signal converting apparatus may serve to enhance the sound quality of the audio signal in electrical connection with the audio signal reproducing apparatus. In this case, the first mute processing unit 130 provided in the digital signal converting apparatus serves to remove the pop noise generated when a power source of the digital signal converting apparatus is turned on/off by muting the audio signal at a predetermined mute timing.

The first mute processing unit 130 primarily mutes the audio signal to remove pop noise related to the audio signal, in particular, negative pop noise.

When the input audio signal is primarily muted at a predetermined timing by the first mute processing unit 130, the second mute processing unit 140 serves to secondarily mute the audio signal based on the mute timing set and adjusted by the timing setting unit 110 and the timing adjusting unit 120.

The second mute processing unit 140 mutes the audio signal at each predetermined timing together with the first mute processing unit 130 to remove the pop noise. In this case, the second mute processing unit 140 may remove positive pop noise related to the audio signal.

Meanwhile, in the embodiment, the mute apparatus 100 may be provided only with the first mute processing unit 130. In this case, the first mute processing unit 130 may serve to remove even the positive pop noise together with the negative pop noise.

Hereinabove, a concept of the mute apparatus 100 proposed by the present invention has been described with reference to FIG. 1. Hereinafter, the mute apparatus 100 will be implemented as a predetermined circuit and described as an embodiment.

FIG. 2 is a circuit diagram specifically illustrating an internal configuration of a mute apparatus according to an embodiment of the present invention. Hereinafter, the internal configuration will be described with reference to FIGS. 1 and 2.

The timing setting unit 110 includes a first resistor 111 and a first capacitor 112. In the exemplary embodiment, the first resistor 111 and the first capacitor 112 have a structure in which the first resistor 111 and the first capacitor 112 are connected in parallel.

The first resistor 111 serves to adjust output voltage in connection with a collector of a first transistor 201. The first resistor 111 may be implemented as R64 as an example.

In the case of the first capacitor 112, one side is connected to the collector of the first transistor 201 and the other side is connected to the ground GND. The first capacitor 112 may be implemented as C222, as an example.

Meanwhile, an emitter of the first transistor 201 is connected to the ground GND and a base of the first transistor 201 is connected to a mute signal input unit 211 that mutes the audio signal in the audio signal reproducing apparatus.

Meanwhile, the mute apparatus 100 may further include a second resistor 221 connected to the first transistor 201 in parallel. In the case of the second resistor 221, one side is connected to the mute signal input unit 211 and the other side is connected to the ground GND. The second resistor 221 as a protective resistor may be implemented as R106 as an example.

As described above, in the present invention, at least two timing adjusting units 120 may be provided in the mute apparatus 100. An embodiment of FIG. 2 is an example of a case where two timing adjusting units 120 are provided in the mute apparatus 1100. Hereinafter, by considering such a point, a first timing adjusting unit 120a and a second timing adjusting unit 120b will be separately described.

The first timing adjusting unit 120a includes a third resistor 121 and second capacitor 122. In the exemplary embodiment, the third resistor 121 and the second capacitor 122 have a structure in which the third resistor 121 and the second capacitor 122 are connected in series.

The third resistor 121 serves to adjust the output voltage in connection with the collector of the second transistor 202. The third resistor 121 may be implemented as R61 as an example.

In the case of the second capacitor 122, one side is connected to the collector of the second transistor 202 and the other side is connected to the ground GND. The second capacitor 122 may be implemented as C213, as an example.

Meanwhile, the emitter of the second transistor 202 is connected to Vcc and the base of the second transistor 202 is connected to the timing setting unit 110.

Meanwhile, the mute apparatus 100 may further include a fourth resistor 222 connected to the third transistor 201 in parallel. The fourth resistor 222 which serves to adjust the output voltage may be implemented as R62, as an example. In the case of the fourth resistor 222, one side is connected to the collector of the second transistor 202 and the other side is connected to the ground GND.

Meanwhile, the mute apparatus 100 may further include a third capacitor 231 connected to the timing setting unit 110. In the case of the third capacitor 231, one side is connected to the first resistor 111 of the timing setting unit 110 and the other side is connected to the ground GND. The third capacitor 231 may be implemented as C218, as an example.

The second timing adjusting unit 120b includes a fifth resistor 123 and a fourth capacitor 124. In the exemplary embodiment, the fifth resistor 123 and the fourth capacitor 124 have a structure in which the fifth resistor 123 and the fourth capacitor 124 are connected in series.

The fifth resistor 123 serves to adjust the output voltage in connection with the first timing adjusting unit 120a. The fifth resistor 123 may be implemented as R63 as an example.

In the case of the fourth capacitor 124, one side is connected to the fifth resistor 123 and the other side is connected to the ground GND. The fourth capacitor 124 may be implemented as C219, as an example.

The mute apparatus 100 may further include a fifth capacitor 232 and a sixth capacitor 233 connected to the second timing adjusting unit 120b. In the exemplary embodiment, the fifth capacitor 232 and the sixth capacitor 233 have a structure in which the fifth capacitor 232 and the sixth capacitor 233 are connected in parallel.

In the case of the fifth capacitor 232, one side is connected to the fifth resistor 123 of the second timing adjusting unit 120b and the other side is connected to the second mute processing unit 140. The fifth capacitor 232 may be implemented as C216, as an example.

In the case of the sixth capacitor 233, one side is connected to the fifth resistor 123 of the second timing adjusting unit 120b and the other side is connected to the second mute processing unit 140 like the fifth capacitor 232. The sixth capacitor 233 may be implemented as C217, as an example.

Although not described below, in the embodiment, the second mute processing unit 140 may be implemented as dual FETs. In this case, the fifth capacitor 232 and the sixth capacitor 233 may be connected to the FETs of the second mute processing unit 140, respectively. The fifth capacitor 232 and the sixth capacitor 233 may be provided in the mute apparatus 100 in an opened form.

The first mute processing unit 130 includes a first field effect transistor (FET) 131 and a second FET 132. When the first mute processing unit 130 is implemented as a single FET, it is difficult to completely remove the pop noise and in particular, it is difficult to solve the pop noise which leaks to a minus side. The pop noise as noise generated when supplying the power or stopping the supply of the power means noise generated due to the voltage of the capacitor charged when a circuit having a capacitor with charged voltage is connected to another electrical circuit.

In the exemplary embodiment, in order to solve such a problem, the first mute processing unit 130 is implemented as the dual FETs. Further, in the exemplary embodiment, such a problem is solved by arranging the first FET 131 and the second FET 132 so that a drain and a source of the first FET 131 and the drain and the source of the second FET 132 face each other.

When the audio signal received through a right input terminal (AUDIO_R_IN) 212 is input into a gate of the first FET 131, the first FET 131 serves to mute the audio signal according to the timings determined by the timing setting unit 110, the first timing adjusting unit 120a, and the second timing adjusting unit 120b and transmit the muted audio signal to the second mute processing unit 140.

Similarly, when the audio signal received through a left input terminal (AUDIO_L_IN) 213 is input into the gate of the second FET 132, the second FET 132 serves to mute the audio signal according to the timings determined by the timing setting unit 110, the first timing adjusting unit 120a, and the second timing adjusting unit 120b and transmit the muted audio signal to the second mute processing unit 140.

The second mute processing unit 140 includes a third FET 141 and a fourth FET 142. The second mute processing unit 140 is implemented as dual FETs like the first mute processing unit 130. Further, the third FET 141 and the fourth FET 142 are arranged so that the drain and the source of the third FET 141 and the drain and the source of the fourth FET 142 face each other.

When the mute-processed audio signal is input from the first FET 131, the third FET 141 serves to mute the audio signal according to the timings determined by the timing setting unit 110, the first timing adjusting unit 120a, and the second timing adjusting unit 120b and output the muted audio signal through a right output terminal (AUDIO_R_OUT) 214.

Similarly, when the mute-processed audio signal is input from the second FET 132, the fourth FET 142 serves to mute the audio signal according to the timings determined by the timing setting unit 110, the first timing adjusting unit 120a, and the second timing adjusting unit 120b and output the muted audio signal through a left output terminal (AUDIO_L_OUT) 215.

FIG. 3 is a reference diagram for describing a function performed by a mute apparatus according to an embodiment of the present invention. Hereinafter, the function will be described with reference to FIGS. 1 and 3.

The mute apparatus 100 proposed by the present invention is used for removing the pop noise generated when the power source is turned on/off after mounting the digital signal converting apparatus on the audio signal reproducing apparatus.

The pop noise includes negative pop noise 310 and positive pop noise 320. The first mute processing unit 130 provided in the mute apparatus 100 primarily mutes the input audio signal at a predetermined mute timing to remove the negative pop noise 310.

On the contrary, the second mute processing unit 140 provided in the mute apparatus 100 secondarily mutes the audio signal primarily mute-processed by the first mute processing unit 130 according to a determined mute timing to remove the positive pop noise 320.

Hereinabove, the mute apparatus 100 proposed by the present invention has been described with reference to FIGS. 1 to 3. Hereinafter, the digital signal converting apparatus including the mute apparatus 100 will be described.

FIG. 4 is a block diagram schematically illustrating an internal configuration of a digital signal converting apparatus according to an embodiment of the present invention.

According to FIG. 4, the digital signal converting apparatus 400 includes a power source unit 410, a clock generating unit 420, a converting unit 430, an amplification unit 440, a mute unit 450, and a connection unit 460.

The digital signal converting apparatus 400 serves to convert the audio signal into an analog signal from a digital signal in electrical connection to an audio signal reproducing apparatus (not illustrated). Specifically, when the audio signal of a digital signal type is input from the audio signal reproducing apparatus, the digital signal converting apparatus 400 converts the audio signal into an analog signal type and then, transmits the converted audio signal to the audio signal reproducing apparatus. The digital signal converting apparatus 400 may contribute to reproducing digital contents and outputting a high-quality sound source through such a process by the audio signal reproducing apparatus.

The digital signal converting apparatus 400 may be implemented as a module type in the present invention. In this case, since users may easily perform change, replacement, upgrade, etc., with respect to the modules, the digital signal converting apparatus 400 has an advantage in that it is easy to change a system depending on a need of the user.

The digital signal converting apparatus 400 may have high power consumption in order to contribute to outputting a high-quality sound source by the audio signal reproducing apparatus. By considering such a point, the digital signal converting apparatus 400 individually controls the converting unit 430 and the amplification unit 440 to minimize power consumption depending on the use.

A layout structure of the power source unit 410, the converting unit 430, and the amplification unit 440 in the digital signal converting apparatus 400 may be arbitrarily changed according to a purpose of noise reduction. Further, locations and a connection relationship of the power source unit 410, the converting unit 430, and the amplification unit 440 in the digital signal converting apparatus 400 may have a design structure optimized to a flow of data or a signal.

A layout or a design of the digital signal converting apparatus 400 may be set by using hardware or software. In changing the modules constituting digital signal converting apparatus 400, initialization of the flow of the data or the signal may be required and the initialization may be automatically set by a module embedded in the hardware itself or by software which may be received in a separate Internet or mobile app.

The power source unit 410 performs a function to supply electrical energy to the clock generating unit 420, the converting unit 430, the amplification unit 440, and the mute unit 450 through a physical action or a chemical action. The power source unit 410 is not provided in the digital signal converting apparatus 400, but may be positioned outside the digital signal converting apparatus 400 and may supply power.

The power source unit 410 may have a circuit structure for reducing noise when considering a characteristic of being sensitive to the noise of the Hi-Fi audio module. As an example, the power source unit 410 may include a plurality of power supply units (not illustrated) and noise removing units (not illustrated). In this case, the power supply units are separated from each other to have a voltage value optimized for reducing the noise.

The power supply unit may use a potential difference generated due to an ionization difference of metal and include a primary battery which may not be charged and a secondary battery which may be charged. The type of power supply unit may be changed according to characteristics of the audio signal reproducing apparatus.

The noise removing unit serves to remove the noise which is induced in the power source unit 410.

The noise removing unit may have a circuit structure in which electrical elements are sequentially connected. In this case, the circuit structure may primarily use a bead for removing a high-frequency noise, secondarily use a low drop out (LDO) regulator, tertiarily use a capacitor having a low serial equivalent resistance value, and quarternarily use a large-capacity capacitor.

The LDO regulator adjusts linearly adjusts the voltage even when supply voltage is very close to output voltage. The LDO regulator has an advantage in that since voltage drop is small and ripple is small, the noise is reduced and since the circuit is simple a price is low.

The clock generating unit 420 serves to generate a clock signal for determining an operation timing of the digital signal converting apparatus 400. The clock generating unit 420 may generate a Master Clock (MCLK), a Left-Right Clock (LRCK), a Bit Clock (BITCLK), etc.

The MCLK means a master clock. The clock generating unit 420 may determine a final operation timing of the digital signal converting apparatus 400 by using the MCLK.

The LRCK means a clock for a left (L) channel and a right (R) channel of a digital audio signal. When L channel information is transmitted, the LRCK may be set to 1 and when R channel information is transmitted, the LRCK may be set to 0.

The BITCLK means a clock which is transmitted in engagement with a bit which is a basis of the digital signal. The clock generating unit 420 may determine whether the digital signal is 0 or 1 by matching synchronization with a bit clock by using the BITCLK.

Clock signals generated by the clock generating unit 420 are input into the audio signal reproducing apparatus. Since the clock generating unit 420 uses a clock generated in a phased lock loop (PLL), the clock generating unit 420 may accurately generate the analog signal. The digital signal converting apparatus 400 directly generates and uses the clocks through the clock generating unit 420 to generate an analog signal of low jitter.

The converting unit 430 serves to convert the digital signal received from the audio signal reproducing apparatus into the analog signal by using synchronized control signals and clock signals.

The converting unit 430 may be implemented by the plurality of modules. In this case, the converting unit 430 is capable of converting a high-quality analog signal through averaging of output noise. However, when the converting unit 430 is implemented as the plurality of modules, power consumption may increase and in this case, such a problem may be solved by individually controlling current of the converting unit 430.

The converting unit 430 may have a spacing structure in order to prevent duplication of a part where digital noise may be induced on the internal circuit pattern. In the spacing structure, the digital signal line and the analog signal line may be spaced apart from each other on a 2-dimensional plane or spatially spaced in different layers in a 3-dimensional space. In this case, a spacing distance may have a predetermined value or more by considering the size and a reproduction sound quality of the digital signal converting apparatus 400.

The synchronization which matches operation timings of the digital signal converting apparatus 400 and the audio signal reproducing apparatus may be implemented by unifying a reference time of the clock signals. In the embodiment, the synchronization may mean matching of data in addition to matching the operation timings of the modules.

The amplification unit 440 serves to amplify the analog signal which is an output of the converting unit 430.

The amplification unit 440 may include a pre-amp for adjusting the analog signal and a power-amp for amplifying the power and may be implemented as an integrated amp in which the pre-amp and the power-amp are combined. However, in the exemplary embodiment, the shape of the amplification unit 440 is not limited thereto and may be arbitrarily changed according to the purpose and the function of the digital signal converting apparatus 400.

The amplification unit 440 may have a design optimized to the converting unit 430 in order to reduce the noise. Further, the wiring of the internal circuit of the amplification unit 440 may have a maximum spacing structure in order to prevent the duplication of the part where the digital noise may be induced. The layout of the spacing structure is the same as the case of the converting unit 430. The spacing distance may have a predetermined value or more by considering the size and a reproduction sound quality of the digital signal converting apparatus 400.

The mute unit 450 serves to mute the audio signal based on a predetermined timing. The mute unit 450 is the same concept as the mute apparatus 100 described above with reference to FIGS. 1 to 3. Accordingly, a detailed description of the mute unit 450 is omitted herein.

The connection unit 460 electrically or mechanically connects the digital signal converting apparatus 400 to the audio signal reproducing apparatus and serves as the passage of the electrical signal between the digital signal converting apparatus 400 and the audio signal reproducing apparatus.

The connection unit 460 may receive the audio signal from the audio signal reproducing apparatus and transmit the received audio signal to the converting unit 430 and include an insulating material in order to prevent the electrical signal from flowing in the air or to a body of the user.

Hereinabove, an embodiment of the present invention has been described with reference to FIGS. 1 to 4. Hereinafter, a preferred type of the present invention which may be deduced from the embodiment will be described.

FIG. 5 is a conceptual diagram schematically illustrating an internal configuration of an audio signal muting apparatus according to a preferred embodiment of the present invention.

According to FIG. 5, the audio signal muting apparatus 500 includes a timing setting unit 510, a timing adjusting unit 520, a mute control unit 530, a first power source unit 540, and a first main control unit 550.

The first power source unit 540 serves to supply power to each component constituting the audio signal muting apparatus 500. The first main control unit 550 serves to control an overall operation of each component constituting the audio signal muting apparatus 500. When it is considered that the audio signal muting apparatus 500 is provided in a digital signal converting apparatus 600 to be described below with reference to FIG. 6, the first power source unit 540 and the first main control unit 550 may not be provided in the embodiment.

The timing setting unit 510 serves to set a timing for removing the pop noise from the audio signal. The timing setting unit 510 is the same concept as the timing setting unit 110 of FIG. 1 except that reference numerals are different.

The timing setting unit 510 may include a first voltage adjusting element and a first charge element.

The first voltage adjusting element adjusts output voltage related to the audio signal. One side of the first voltage adjusting element is connected to a first current control element receiving a mute control signal for muting the audio signal and the other side is connected to the ground GND. The first voltage adjusting element is a concept corresponding to the first resistor of FIG. 2 and the first current control element is a concept corresponding to the first transistor of FIG. 2.

The first charge element is connected to the first voltage adjusting element in parallel. The first charge element is a concept corresponding to the first capacitor of FIG. 2.

When the timing for removing the pop noise is set by the timing setting unit, the timing adjusting unit 520 serves to adjust the timing. The timing adjusting unit 520 is the same concept as the timing setting unit 120 of FIG. 1 except that reference numerals are different.

At least two timing adjusting units 520 may be provided in the audio signal muting apparatus 500. When two timing adjusting units 520 are provided in the audio signal muting apparatus 500, the timing adjusting unit 520 may include a third voltage adjusting element, a second charge element, a fifth voltage adjusting element, and a fourth charge element.

The third voltage adjusting element serves to additionally adjust the output voltage with respect to the audio signal of which output voltage is adjusted by the timing setting unit 510. One side of the third voltage adjusting element is connected to a second current control element connected to the first current control element receiving the mute control signal for muting the audio signal and the other side is connected to the fifth voltage adjusting element in series through a second path. In the above description, the first current control element is an element that performs a switching function in connection to the ground and the second current control element is an element that is connected to the power source and performs the switching function. The third voltage adjusting element is a concept corresponding to the third resistor of FIG. 2 and the second current control element is a concept corresponding to the second transistor of FIG. 2. Further, the fifth voltage adjusting element is a concept corresponding to the fifth resistor of FIG. 2.

The fifth voltage adjusting element serves to additionally adjust the output voltage with respect to the audio signal of which output voltage is adjusted by the third voltage adjusting element. One side of the fifth voltage adjusting element is connected to the third voltage adjusting element in series through the second path and the other side is connected to the mute control unit.

Meanwhile, the second charge element is connected to the third voltage adjusting element in series through a first path and the fourth charge element is connected to the fifth voltage adjusting element in series. The second charge element is a concept corresponding to the second capacitor of FIG. 2 and the fourth charge element is a concept corresponding to the fourth capacitor of FIG. 2.

The timing setting unit 510 serves to set an overall mute timing in the embodiment and the timing adjusting unit 520 serves to set a fine timing of the mute in the embodiment. By considering such a point, the timing setting unit 510 may set the timing based on at least one pop noise of which magnitude is equal to or larger than a first reference value and the timing adjusting unit 520 may adjust the timing based on at least one pop noise of which magnitude is equal to or larger than a second reference value smaller than the first reference value.

When the timing for removing the pop noise is set and adjusted by the timing setting unit 510 and the timing adjusting unit 520, the mute control unit 530 serves to mute the audio signal based on the timing.

The mute control unit 530 may include a first mute processing unit 531 and a second mute processing unit 532.

The first mute processing unit 531 serves to mute the audio signal at a time when the negative pop noise exists based on the timing. The first mute processing unit 531 is the same concept as the first mute processing unit 130 of FIG. 1 except that only reference numerals are different.

The second mute processing unit 532 serves to mute the audio signal at a time when the positive pop noise exists based on the timing. The second mute processing unit 532 is the same concept as the second mute processing unit 140 of FIG. 1 except that only reference numerals are different.

At least one of the first mute processing unit 531 and the second mute processing unit 532 may include two voltage control elements. When the first mute processing unit 531 includes two voltage control elements, pins of the first voltage control element provided in the first mute processing unit 531 may be disposed to face the pins of the second voltage control element provided in the first mute processing unit 531. Further, the pins of the third voltage control element provided in the second mute processing unit 532 may be disposed to face the pins of the fourth voltage control element provided in the second mute processing unit 532. The first voltage control element is a concept corresponding to the first FET of FIG. 2 and the second voltage control element is a concept corresponding to the second FET of FIG. 2. Further, the pins of each voltage control element are concepts corresponding to a drain and a source of the FET.

Next, the digital signal converting apparatus 600 including the audio signal muting apparatus 500 will be described.

FIG. 6 is a conceptual diagram schematically illustrating an internal configuration of a digital signal converting apparatus according to a preferred embodiment of the present invention.

According to FIG. 6, the digital signal converting apparatus 600 includes a converting unit 610, a clock generating unit 620, an amplification unit 630, a second power source unit 640, a second main control unit 650, and the audio signal muting apparatus 500.

The second power source unit 640 serves to supply power to each component constituting the digital signal converting apparatus 600. The second main control unit 650 serves to control an overall operation of each component constituting the digital signal converting apparatus 600. When it is considered that the digital signal converting apparatus 600 may operate in electrical connection to the audio signal reproducing apparatus, the second power source unit 640 and the second main control unit 650 may not be provided in the embodiment.

The converting unit 610 serves to convert, when a digital audio signal is input, the digital audio signal into an analog audio signal. The converting unit 610 is the same concept as the converting unit 430 of FIG. 4 except that only reference numerals are different.

The clock generating unit 620 serves to determine the operation timing when converting the digital audio signal into the analog audio signal based on the digital audio signal. The clock generating unit 620 is the same concept as the clocking generating unit 420 of FIG. 4 except that only reference numerals are different.

The amplification unit 630 serves to amplify the analog audio signal. The amplification unit 630 is the same concept as the amplification unit 440 of FIG. 4 except that only reference numerals are different.

The audio signal muting apparatus 500 serves to mute the analog audio signal based on the timing for removing the pop noise. The audio signal muting apparatus 500 is described above with reference to FIG. 5 and thus herein, a detailed description thereof is omitted.

Hereinabove, even if it is described that all of constituent elements constituting the embodiment of the present invention are coupled as a single unit or coupled to be operated as a single unit, the present invention is not necessarily limited to the embodiment. That is, among the components, one or more constituent elements may be selectively coupled to be operated within the scope of the object of the present invention. Further, each of all components may be implemented as one independent hardware, but some or all of respective components are selectively combined to be implemented as a compute program having a program module performing some or all functions combined one or a plurality of hardware. Further, the computer program is stored in computer readable media including a USB memory, a CD disk, a flash memory, etc., and read and executed by a computer to implement the embodiments of the present invention. Media of the computer program may include a magnetic recording medium, an optical recording medium, and the like.

Further, if not contrarily defined in the detailed description, all terms used herein including technological or scientific terms have the same meanings as those generally understood by a person with ordinary skill in the art. A generally used terminology which is defined in a dictionary should be interpreted to be equal to a contextual meaning of the related technology but is not interpreted to have an ideal or excessively formal meaning, if it is not apparently defined in the present invention.

The above description just illustrates the technical spirit of the present invention and various changes, modifications, and substitutions can be made by those skilled in the art to which the present invention pertains without departing from an essential characteristic of the present invention. Therefore, the exemplary embodiments and the accompanying drawings disclosed in the present invention are used to not limit but describe the technical spirit of the present invention and the scope of the technical spirit of the present invention is not limited by the exemplary embodiments and the accompanying drawings. The protective scope of the present invention should be construed based on the following claims, and all the technical concepts in the equivalent scope thereof should be construed as falling within the scope of the present invention.

INDUSTRIAL APPLICABILITY

The present invention may be applied to a digital signal converting apparatus that is connected to an audio signal reproducing apparatus to convert a digital audio signal into an analog audio signal. Further, the present invention may be applied to an audio signal reproducing apparatus such as a computer, a video apparatus, an MP3 player, an audio apparatus in an electrical component for a vehicle, etc.

The invention claimed is:

1. An apparatus for muting an audio signal, the apparatus comprising:

a timing setting unit setting a timing for removing pop noise from an audio signal;

a timing adjusting unit adjusting the timing; and a mute control unit muting the audio signal based on the timing, wherein the mute control unit includes:

a first mute processing unit muting the audio signal at a time when negative pop noise exists based on the timing, and a second mute processing unit muting the audio signal at a time when positive pop noise exists based on the timing.

2. The apparatus of claim 1, wherein the first mute processing unit or/and the second mute processing unit includes two voltage control elements.

3. The apparatus of claim 2, wherein pins of a first voltage control element provided in the first mute processing unit are disposed to face the pints of a second voltage control element provided in the first mute processing unit, and the pins of a third voltage control element provided in the second mute processing unit are disposed to face the pints of a fourth voltage control element provided in the second mute processing unit.

4. The apparatus of claim 1, wherein the timing setting unit includes a first voltage adjusting element adjusting output voltage related to the audio signal, and a first charge element connected to the first resistor in parallel.

5. The apparatus of claim 4, wherein one side of the first voltage adjusting element is connected to a first current control element receiving a mute control signal for muting the audio signal and the other side is connected to a ground GND.

6. The apparatus of claim 1, wherein at least two timing adjusting units are provided.

7. The apparatus of claim 1, wherein the timing adjusting unit includes a third voltage adjusting element additionally adjusting output voltage with respect to the audio signal of which output voltage is adjusted by the timing setting unit, a second charge element connected to the third voltage adjusting element in series through a first path, a fifth voltage adjusting element additionally adjusting the output voltage with respect to the audio signal of which output voltage is adjusted by the third voltage adjusting element, and a fourth charge element connected to the fifth voltage adjusting element in series.

8. The apparatus of claim 7, wherein one side of the third voltage adjusting element is connected to a second current control element connected to the first current control element receiving the mute control signal for muting the audio signal and the other side is connected to the fifth voltage adjusting element through a second path, and one side of the fifth voltage adjusting element is connected to the third voltage adjusting element in series through the second path and the other side of the fifth voltage adjusting element is connected to the mute control unit.

9. The apparatus of claim 8, wherein the first current control element is an element that performs a switching function in connection to the ground and the second current control element is an element that is connected to a power source and performs the switching function.

10. The apparatus of claim 1, wherein the timing setting unit sets the timing based on at least one pop noise of which magnitude is equal to or larger than a first reference value, and the timing adjusting unit adjusts the timing based on at least one pop noise of which magnitude is equal to or larger than a second reference value smaller than the first reference value.

11. An apparatus for converting a digital signal, the apparatus comprising:

a converting unit converting, when a digital audio signal is input, the digital audio signal into an analog audio signal;

a clock generating unit determining an operation timing when converting the digital audio signal into the analog audio signal based on the digital audio signal;

an amplification unit amplifying the analog audio signal; and an audio signal muting apparatus muting the analog audio signal based on a timing for removing pop noise, wherein the audio signal muting apparatus includes a timing setting unit setting a timing for removing pop noise from the analog audio signal, a timing adjusting unit adjusting the timing, and a mute control unit muting the analog audio signal based on the timing, and wherein the mute control unit includes a first mute processing unit muting the audio signal at a time when negative pop noise exists based on the timing, and a second mute processing unit muting the audio signal at a time when positive pop noise exists based on the timing.

12. The apparatus of claim 11, wherein the mute control unit includes:

a third voltage adjusting element additionally adjusting output voltage with respect to the audio signal of which output voltage is adjusted by the timing setting unit, a second charge element connected to the third voltage adjusting element in series through a first path, a fifth voltage adjusting element additionally adjusting the output voltage with respect to the audio signal of which output voltage is adjusted by the third voltage adjusting element, and a fourth charge element connected to the fifth voltage adjusting element in series.

* * * * *